United States Patent [19]

Chiang et al.

[11] 4,009,516
[45] Mar. 1, 1977

[54] PYROELECTRIC DETECTOR FABRICATION

[75] Inventors: Alice M. Chiang, Framingham; Brian W. Denley, Melrose; Richard L. Schapker, North Andover, all of Mass.

[73] Assignee: Honeywell Inc., Minneapolis, Minn.

[22] Filed: Mar. 29, 1976

[21] Appl. No.: 671,913

[52] U.S. Cl. .................................. 29/592; 29/25.35; 29/424; 250/338; 250/352
[51] Int. Cl.² ........................................ H01L 37/00
[58] Field of Search ................ 29/592, 572, 25.35, 29/424; 250/338, 352; 73/355 R

[56] References Cited

UNITED STATES PATENTS

| 3,571,592 | 2/1971 | Glass | 250/338 |
| 3,831,029 | 8/1974 | Jones et al. | 250/338 |
| 3,924,312 | 12/1975 | Coussot | 29/25.35 |

*Primary Examiner*—Carl E. Hall
*Attorney, Agent, or Firm*—David R. Fairbairn

[57] ABSTRACT

Pyroelectric detectors are mounted on a substrate having a plurality of wax-filled cavities. The wax is then dissolved to provide a low thermal loss mounting structure for the detectors.

21 Claims, 15 Drawing Figures

PYROELECTRIC DETECTOR FABRICATION

BACKGROUND OF THE INVENTION

The present invention relates to pyroelectric detectors. In particular, the present invention relates to improved fabrication techniques for high performance infrared pyroelectric detectors.

Pyroelectric detectors are a class of thermal detectors which have been the object of considerable research and development effort in recent years. When a pyroelectric detector views an infrared source, the temperature of the pyroelectric detector is altered. This temperature change causes a change in spontaneous polarization of the detector material, which, in turn, causes a charge to flow.

Ideally, a pyroelectric detector would be "free hanging" so that thermal loss to the surroundings would be by radiative transfer only. The free hanging detector has maximum responsivity.

In actual use, the ideal free hanging structure is not practical. The pyroelectric detector must be mounted in some manner to a substrate. Heat diffusion into the substrate causes a degradation of the responsivity of the pyroelectric detector at low frequencies. The effects of mounting a pyroelectric detector on a substrate have been discussed by B. R. Holeman, Infrared Physics, 12, 125 (1972).

The achievement of high detectivity pyroelectric detectors depends strongly upon the ability to fabricate a pyroelectric detector having a thickness of less than about 10 microns and the development of a mounting scheme in which the detector approximates a free hanging device. The requirement of a very thin device complicates the mounting of the detectors.

One technique for reducing thermal losses to the substrate is to provide a substrate having an opening. The pyroelectric detector is mounted over the opening so that only the outer edge of the pyroelectric detector is actually bonded to the substrate. Examples of this approach are shown in U.S. Pat. No. 3,571,592 by A. M. Glass and in British Pat. No. 1,337,735 by Keve et al.

While the mounting of a pyroelectric detector over a hole or cavity in a substrate does reduce thermal loss effects, it also complicates fabrication of the detector. Detector fabrication becomes particularly difficult when very small and very thin pyroelectric detector elements are fabricated. Batch fabrication of pyroelectric detectors and detector array fabrication is particularly difficult.

SUMMARY OF THE INVENTION

The present invention is an improved method of fabricating pyroelectric detectors. A substrate of a first material having an opening or cavity is provided. A pyroelectric body is mounted on the substrate with a first portion of the body is contact with the substrate and a second portion extending over the opening. The opening is then filled with a second material. After the pyroelectric body is processed to form a pyroelectric detector, the second material is removed from the opening.

DETAILED DESCRIPTION OF THE PREFERRED EMBODIMENTS

Figure 2:
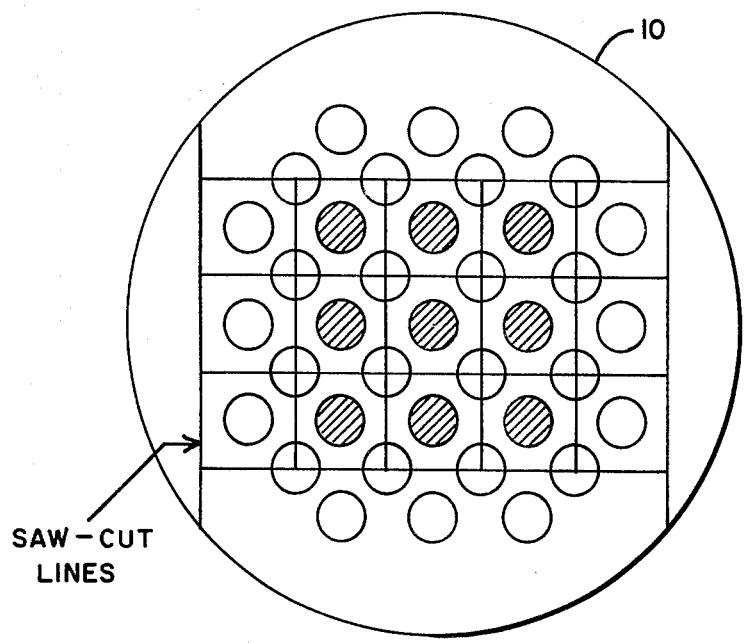
FIG. 2 shows a top view of a substrate for use in one embodiment of the present invention.
Figure 3A:
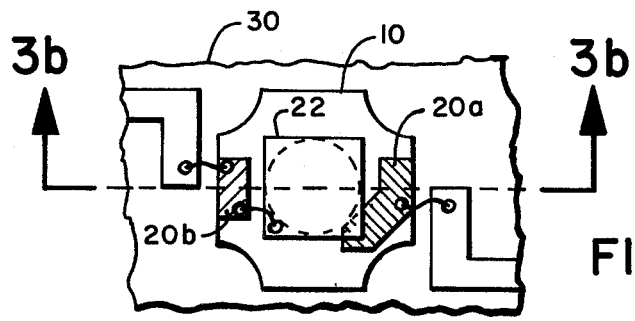
FIGS. 3a and 3b show top and cross sectional side views, respectively, of a pyroelectric detector fabricated by the method of the present invention.
Figure 3B:
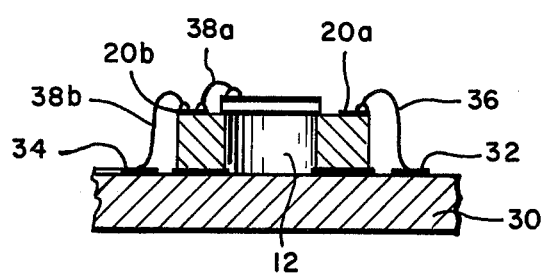

FIGS. 1a – 1l show steps of the process of the present invention, which results in a pyroelectric detector which is supported only at its very edge by a substrate. In addition, the substrate has high mechanical strength during the fabrication process, thereby allowing fabrication of very thin pyroelectric detectors. For clarity, FIGS. 1a – 1l, as well as FIGS. 2, 3a, and 3b are not to scale.

Figure 1A:
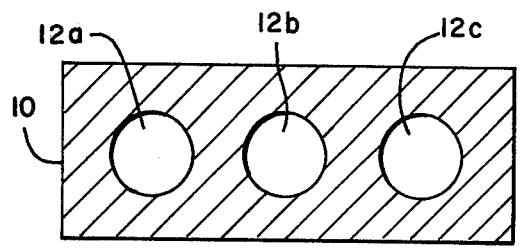
FIGS. 1a – 1l show the pyroelectric detector fabrication process of the present invention.
Figure 1B:
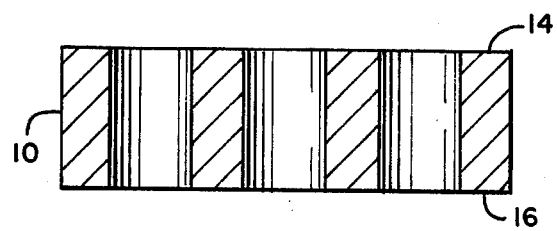

In FIG. 1a, a top view of substrate 10 is shown. Substrate 10 is preferably a glass material which has a plurality of cavities or openings 12a, 12b, and 12c. FIG. 1b is a cross sectional side view of substrate 10 showing top surface 14 and bottom surface 16 of substrate 10. In one preferred embodiment of the present invention, substrate 10 has a thickness of about 0.5 millimeters, and the openings have diameters of about 1 millimeter.

Figure 1C:
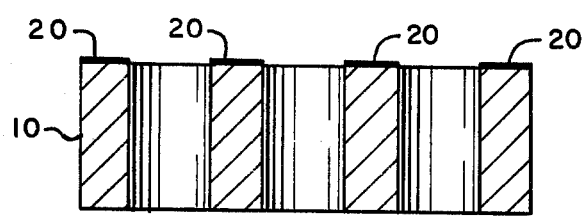

In FIG. 1c, electrode patterns 20 have been formed on surface 14 of substrate 10. These electrode patterns are used to make electrical contact to the backside of the pyroelectric detector and, optionally, to the front side of the detector by means of wire conductors.

Figure 1D:
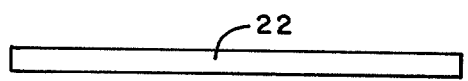

In FIG. 1d, a body 22 of pyroelectric detector material is mechanically polished to a thickness of preferably about 40 microns. The pyroelectric detector material is preferably strontium barium niobate (SBN), although other pryoelectric detector materials such as triglycine sulfate (TGS) or lanthanum-modified lead zirconate titanate (PLZT) may also be used.

Figure 1E:
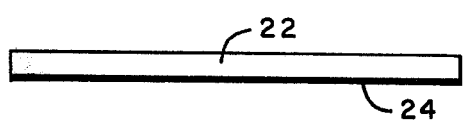

In FIG. 1e, an electrode is formed on the backside of pyroelectric body 22. This backside electrode 24 may be formed by any one of a number of deposition techniques, such as vapor deposition, electro-deposition, or sputtering.

Figure 1F:
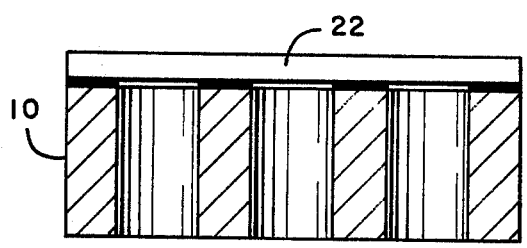

In FIG. 1f, pyroelectric body 22 is mounted onto substrate 10. The bonding is preferably by two types of epoxy: electrically conducting and non-conducting. The electrically conducting epoxy is disposed on the surfaces to be bonded such that it is between electrode surfaces 20 and 24 at only one or more corners of a pyroelectric detector after it has been delineated, thus forming an electrical contact. The non-conducting epoxy is placed on the remaining surfaces for generalized mechanical bonding.

Figure 1G:
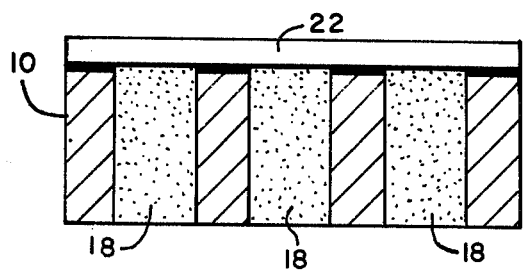

In FIG. 1g, the openings 12a, 12b, and 12c of FIG. 1a have been filled with a second material 18. Openings 12a, 12b, and 12c have been back filled with a second material 18. In a preferred embodiment of the present invention, the second material 18 is glycol phylate wax, which hardens at room temperature and which is dissolvable in a solvent such as acetone. The purpose of material 18 is to provide mechanical strength to the substrate during the fabrication process. Although glycol phylate wax is the preferred material for use in the present invention, other materials may be used provided that they are hard at room temperature and are capable of later being removed. The preferred removal technique is by dissolving the second material. The solvent must dissolve material 18 without affecting substrate 10 or the pyroelectric detector.

Figure 1H:
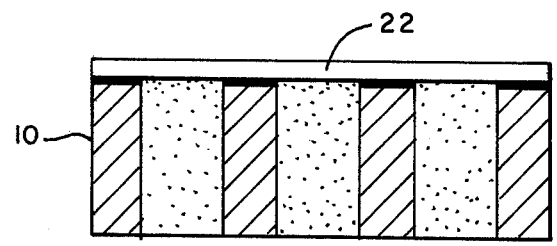

In FIG. 1h, pyroelectric body 22 is reduced in thickness to the final desired thickness. In preferred embodiments, this thickness is approximately 10 microns. The thickness reduction is preferably performed by a combination of mechanical polishing and chemical etching.

Figure 1I:
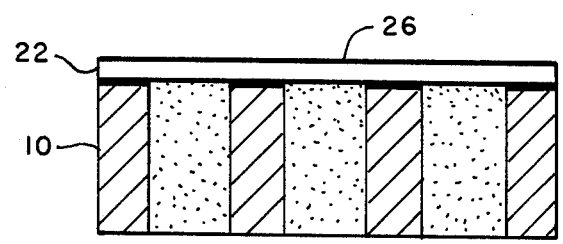

In FIG. 1i, front side electrode 26 is formed on pyroelectric body 22. Electrode 26 is preferably gold or platinum and is blackened to increase the absorption of thermal radiation. Once the front and backside electrodes have been applied, pyroelectric body 22 is electrically poled. Poling is accomplished by applying an electric field to body 22 while maintaining body 22 at an elevated temperature.

Figure 1J:
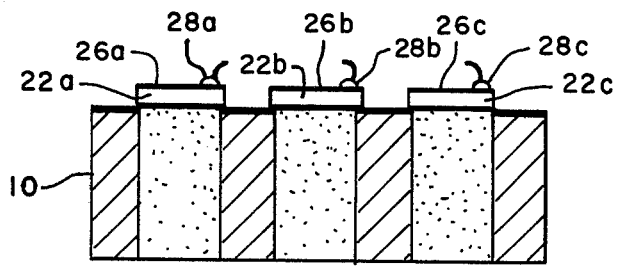

In FIG. 1j, the individual detector element 22a, 22b, 22c have been delineated. This may be accomplished by etching or by air abrasion techniques. The size of individual detectors 22a, 22b, and 22c is only slightly larger than the diameter of openings 12a, 12b, and 12c. The areas of detectors 22a, 22b, and 22c in contact with substrate 10 are much smaller than the areas extending over the filled openings. FIG. 1j also shows bonds 28a, 28b, and 28c, which have been applied to the front side electrode. These bonds are preferably made by thermal compression techniques.

Figure 1K:
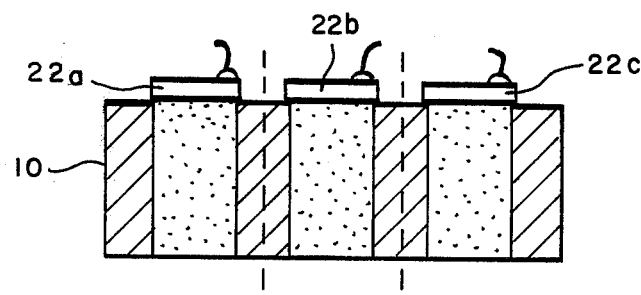

In FIG. 1k, the individual detector elements are separated by cutting along the dashed lines shown in FIG. 1k. This cutting is preferably done by sawing.

Figure 1L:
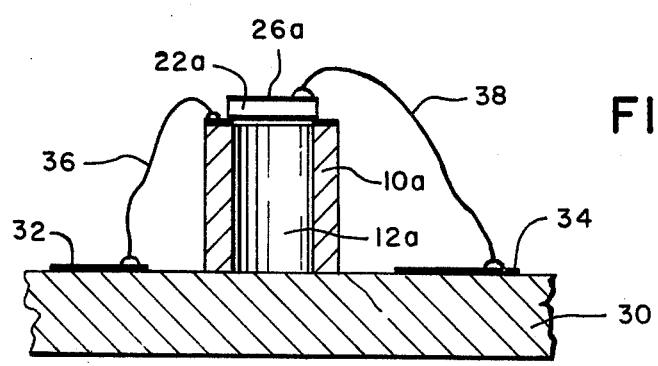

After the individual detector elements and the substrates have been cut, the second material 18 is removed from the openings 12a, 12b, and 12c. When second material 18 is glycol phylate wax, removal is preferably by dissolving the wax with acetone. The detector and the substrate are then bonded to another, larger substrate. The resulting device is shown in FIG. 1l. Substrate 10a is bonded to substrate 30. In preferred embodiments, substrate 30 is an alumina substrate having plated electrodes 32 and 34 on its surface. Wires 36 and 38 make an electrical connection between the pyroelectric detector and electrodes 32 and 34.

The fabrication technique of the present invention has several advantages. First, it allows fabrication of very thin edge-mounted pyroelectric detectors. Second, the method is applicable to batch fabrication of large numbers of detectors at a single time and to detector array fabrication. Detector arrays can be formed by not separating the individual detectors at the end of the process. Third, the process is a high yield process since the back-filled substrate has high mechanical strength during the entire fabrication process.

FIG. 2 shows a top view of a substrate for use in one preferred embodiment of the present invention. The substrate of FIG. 2 is generally similar to the substrate described in FIGS. 1a – 1l, and similar numerals and letters have been used to designate similar elements. Substrate 10 in FIG. 2 contains 37 holes of identical diameter. In one preferred embodiment, the holes have a diameter of about 1 millimeter and are on 2 millimeter centers in a hexagonal pattern.

In the embodiment shown in FIG. 2, nine holes of the array will be covered by detectors. These holes have been shaded in FIG. 2 for purposes of illustration. Also shown in FIG. 2 are the saw cut lines where substrate 10 will be sawed to separate the detectors.

FIGS. 3a and 3b show a detector fabricated on one of the segments of substrate 10 of FIG. 2. Once again, the elements of FIG. 3a are generally similar to those shown in FIGS. 1a – 1k, and similar elements are used to designate similar elements.

In FIGS. 3a and 3b, pyroelectric detector 22 is mounted on substrate 10. Pyroelectric detector 22 is approximately square with sides which are approximately equal to the diameter of hole 12. The top surface of substrate 10 includes contact pads 20a and 20b. Contact 20a makes electrical contact to back side electrode 24 of pyroelectric detector 22. Contact pad 20b is connected to front side contact 26 by wire 38a. Wire 38b extends from contact pad 20b to electrode 34 on substrate 30. Wire 36 connects contact pad 20a with electrode 32.

In conclusion, the fabrication process of the present invention provides a simple and effective technique for fabricating high detectivity pyroelectric detectors. The process is amenable to batch fabrication and to fabrication of detector arrays.

Although the present invention has been described with reference to a series of preferred embodiments, workers skilled in the art will recognize that changes may be made in form and detail without departing from the spirit and scope of the invention. For example, although the filling of the cavities preferably occurs after the detector material is attached to the substrate, the cavities may be filled prior to attachment of the detector material. The later filling of the cavities is preferred because it provides somewhat better mechanical support during the later processing of the detector material.

The embodiments of the invention in which an exclusive property or right is claimed are defined as follows:

1. A method of fabricating a pyroelectric detector, the method comprising:
   providing a substrate of a first material, the substrate having first and second surfaces and a cavity therein;
   mounting a pyroelectric body on the first surface of the substrate with a first portion of the body in contact with the substrate and a second portion extending over the cavity;
   filling the cavity with a second material; processing the pyroelectric body, after filling the cavity, to form a pyroelectric detector; and
   removing the second material from the cavity after processing the pyroelectric body.

2. The method of claim 1 wherein the area of the first portion of the body is much less than the area of the second portion.

3. The method of claim 1 wherein the second material is a wax.

4. The method of claim 3 wherein removing the second material comprises dissolving the second material in a solvent which does not affect the first material.

5. The method of claim 4 wherein the second material is glycol phylate wax.

6. The method of claim 5 wherein the solvent is acetone.

7. The method of claim 1 and further comprising:
   forming an electrode layer on a first surface of the pyroelectric body prior to mounting.

8. The method of claim 7 and further comprising forming an electrode layer on the first surface of the substrate, whereby the electrode layer on the first surface of the pyroelectric body is in contact with the electrode layer on the first surface of the substrate when the pyroelectric body is mounted.

9. The method of claim 7 wherein processing the pyroelectric body comprises:
reducing the pyroelectric body to a final desired thickness.

10. The method of claim 9 wherein processing the pyroelectric body further comprises:
forming an electrode on a second surface of the pyroelectric body after reducing the thickness of the pyroelectric body to the final desired thickness.

11. A method of batch fabricating pyroelectric detectors, the method comprising:
providing a substrate of a first material, the substrate having first and second surfaces and a plurality of cavities therein;
mounting a pyroelectric body on the first surface;
filling the plurality of openings with a second material;
delineating individual pyroelectric detector elements whereby each detector element has a first portion in contact with the substrate and a second portion extending over one of the plurality of filled cavities; and
removing the second material from the cavities.

12. The method of claim 11 and further comprising separating the individual detector elements.

13. The method of claim 11 wherein the second material is a wax.

14. The method of claim 11 wherein removing the second material comprises dissolving the second material in a solvent which does not affect the first material.

15. The method of claim 14 wherein the second material is glycol phylate wax.

16. The method of claim 15 wherein the solvent is acetone.

17. The method of claim 11 and further comprising:
forming an electrode layer on a first surface of the pyroelectric body prior to mounting.

18. The method of claim 11 and further comprising:
reducing the pyroelectric body to a final desired thickness after mounting.

19. The method of claim 18 and further comprising:
forming an electrode on a second surface of the pyroelectric body after reducing the thickness of the pyroelectric body to the final desired thickness.

20. A method of fabricating a pyroelectric detector, the method comprising:
providing a substrate of a first material, the substrate having first and second surfaces and a cavity therein;
filling the cavity with a second material;
mounting a pyroelectric body on the first surface of the substrate with a first portion of the body in contact with the substrate and a second portion extending of the filled cavity;
removing the second material from the cavity.

21. A method of batch fabricating pyroelectric detectors, the method comprising:
providing a substrate of a first material, the substrate having first and second surfaces and a plurality of cavities therein;
filling the plurality of openings with a second material;
mounting a pyroelectric body on the first surface;
delineating individual pyroelectric detector elements whereby each detector element has a first portion in contact with the substrate and a second portion extending over one of the plurality of filled cavities; and
removing the second material from the cavities.

* * * * *